United States Patent [19]

Kamasaki et al.

[11] Patent Number: 4,796,084
[45] Date of Patent: Jan. 3, 1989

[54] SEMICONDUCTOR DEVICE HAVING HIGH RESISTANCE TO ELECTROSTATIC AND ELECTROMAGNETIC INDUCTION USING A COMPLEMENTARY SHIELD PATTERN

[75] Inventors: Keiji Kamasaki; Tadao Dengo, both of Kanagawa; Ikuo Fukuda, Fukuoka; Hideaki Motojima, Kanagawa, all of Japan

[73] Assignee: Kabushiki Kaisha Toshiba, Tokyo, Japan

[21] Appl. No.: 862,488

[22] Filed: May 12, 1986

[30] Foreign Application Priority Data

May 13, 1985 [JP] Japan .................. 60-100913

[51] Int. Cl.[4] ............ H01L 27/14; H01L 23/48; H01L 25/04; H01L 31/12
[52] U.S. Cl. .................. 357/84; 357/30; 357/68; 357/71; 357/19
[58] Field of Search ............ 357/84, 30 Q, 30 L, 357/68, 71, 19

[56] References Cited

FOREIGN PATENT DOCUMENTS

| 58491 | 5/1977 | Japan | 357/84 |
| 45070 | 4/1981 | Japan | 357/84 |
| 54270 | 3/1984 | Japan | 357/30 L |
| 178646 | 9/1985 | Japan | 357/84 |
| 177685 | 9/1985 | Japan | 357/84 |

Primary Examiner—Martin H. Edlow
Assistant Examiner—David R. Josephs
Attorney, Agent, or Firm—Banner, Birch, McKie & Beckett

[57] ABSTRACT

A semiconductor device is disclosed with a conductive on-chip shield film formed on its surface. The on-chip shield film is patterned in a manner substantially complementary to the pattern of the wiring layer of the semiconductor device so that the shield film does not cover portions of the semiconductor device which are covered by the wiring-pattern layer. In this manner, the on-chip shield film of the semiconductor device provides high resistance to electrostatic and electromagnetic induction while maintaining the ability of the device to withstand changes in ambient temperature.

12 Claims, 1 Drawing Sheet

SEMICONDUCTOR DEVICE HAVING HIGH RESISTANCE TO ELECTROSTATIC AND ELECTROMAGNETIC INDUCTION USING A COMPLEMENTARY SHIELD PATTERN

BACKGROUND OF THE INVENTION

The present invention relates to a semiconductor device having a high resistance to electrostatic and electromagnetic induction, and, more particularly, to an improved shield for a semiconductor device which provides high resistance to electrostatic and electromagnetic induction without reducing the ability of the semiconductor device to withstand adverse environmental conditions.

Semiconductor devices have been used in an ever increasing variety of applications, such as integrated circuits (ICs) and photocouplers. As the fields of application have increased, semiconductor devices have also been subjected to more adverse environmental conditions. As an example, in many applications the air surrounding the semiconductor device is teeming with electromagnetic waves. These waves tend to induce currents in the metallic or conductive portions of the device and cause erroneous and/or faulty operation. Further, in many present day applications semiconductor devices are coupled to circuits wherein large surge voltages, caused by the switching of power circuits, occur in the power line. These voltages, like electromagnetic air waves, tend to induce unwanted currents which result in erroneous operation.

To protect semiconductor devices from operation failure due to such electromagnetic waves and surge voltages, on-chip shield structures have been developed. Such structures generally comprise an insulating film formed over the entire surface of the semiconductor device. For example, Japanese Patent Disclosure No. 60-4257 describes a method for improving IC resistance to electromagnetic radiation by utilizing an on-chip shield. Also, Japanese Patent Disclosure No. 52-79789 describes an on-chip shield for preventing operation failures due to surge voltage induction in a photocoupling semiconductor. However, the above described on-chip shields are subject to failure or temporary operational errors when used in an environment with significant temperature variations. As a result, the device cannot be reliably operated under varying temperature conditions.

It is desirable, therefore, to provide apparatus for shielding a semiconductor device from electromagnetic air waves and power line surge voltages. Further, it is desirable to provide such a device which is also substantially impervious to significant temperature variations. It is also desirable to provide such a device which is particularly suited for use with optical coupling devices. As always, it is desirable to provide such a device while maintaining high yield and simultaneously minimizing production costs.

SUMMARY OF THE INVENTION

It is, therefore, an object of the present invention to provide a semiconductor device with an on-chip shield structure which prevents operation errors caused by electromagnetically or electrostatically induced currents.

It is another object of the present invention to provide an on-chip structure for preventing operation errors caused by electrostatic and electromagnetic induction without reducing the ability of the semi-conductor device to withstand significant temperature variations.

It is a further object of the present invention to provide a photocoupler including a reliably shielded optical receiver.

It is a still further object of the present invention to provide an improved on-chip shield structure for a semiconductor device which can be provided without sacrificing manufacturing yield or increasing production costs.

The present invention addresses the foregoing objects by providing method and apparatus for inexpensively and reliably shielding a semiconductor device, wherein the resulting semiconductor device is substantially impervious to significant temperature variations. In accordance with the method of present invention, a semiconductor device is covered with a conductive shield film, which film is constructed in a manner to prevent undesirable electrical contact between the conductive shield film and the wiring pattern layer of the semiconductor device.

A semiconductor device in accordance with the present invention includes a semiconductor element formed in a semiconductor substrate. A first insulating layer is provided over the semiconductor substrate and is covered by a wiring-pattern layer. A second insulating layer is formed over the wiring-pattern layer. A conductive shield is provided to cover the semiconductor device and is patterned to complement the wiring-pattern layer such that the conductive shield film does not substantially cover those portions of the semiconductor device which are covered by the wiring-pattern layer. By constructing the conductive shield film so as to complement the wiring-pattern layer, undesirable electrical contact therebetween is prevented.

BRIEF DESCRIPTION OF THE DRAWINGS

Further features, objects and advantages of the invention will become apparent from a reading of the following Detailed Description, taken in conjunction with the drawings, in which.

DETAILED DESCRIPTION OF THE DRAWINGS

The present invention is based on findings obtained through extensive study directed to semiconductor devices with on-chip conductive shield structures having various arrangements. The study revealed that conventional semiconductor devices with on-chip conductive shields were unreliable because undesirable electrical contact occurred between the conductive shield film covering the surface of the semiconductor device and the metal wiring layer integrated therein. This adverse electrical contact is believed to be primarily due to differences in the thermal expansion coefficients of the metal wiring layer, the conductive shield film and an insulating film formed between the wiring layer and the conductive shield film. The difference in thermal expansion coefficients, coupled with temperature variations during operation, results in small pinholes being formed in the insulating film. These pinholes grow with time to cause adverse electrical contact between the metal wiring layer and the conductive shield film.

Therefore, in accordance with the present invention, reliable shielding is provided in temperature varying conditions by constructing the conductive shield in such a manner to prevent undesired electrical contact with the wiring layer. This is accomplished by patterning the conductive shield film such that it does not substantially cover those portions of the semiconductor device above the wiring-pattern layer.

Figure 1:
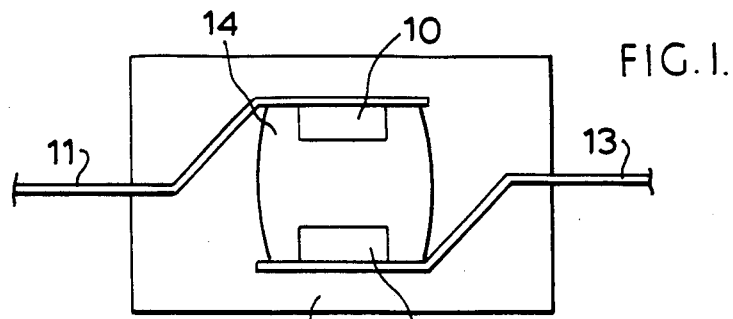
FIG. 1 is a sectional view of a photocoupler including an optical transmitter and receiver.

With reference to FIG. 1, a photocoupler usually comprises a light-emitting chip 10 on a first lead frame 11. Light-receiving chip 12 is mounted on a second lead frame 13, and light guide 14 is interposed between chips 10 and 12. The above elements are encapsulated in mass 15.

When an input signal is supplied to light-emitting chip 10, the chip emits light toward light-receiving chip 12 via light guide 14. The light-receiving chip then provides an electrical signal output in response to receipt of the light emitted by light-emitting chip 10. Theoretically, unless the input signal is supplied, the output signal will not be generated. However, in conventional photocouplers the output signal often appears without supplying the input signal. This occurs because light guide 14, which is usually made of a resin such as silicon, acts as a dielectric so that capacitance is created between chips 10 and 12. Therefore, when a voltage difference occurs between chips 10 and 12, such as may be caused by a surge voltage, current flows in light-receiving chip 12 resulting in faulty operation of the photocoupler.

In accordance with the present invention, a photocoupler is provided which does not exhibit faulty operation in response to electromagnetically or electrostatically induced currents. This is accomplished by providing an on-chip shield which acts as an electrode on the side of the light-receiving chip to receive electrostatic or electromagnetic energy. As a result, current flows to ground through the shield rather than through the photocoupler, thereby eliminating faulty operation.

Figure 2:
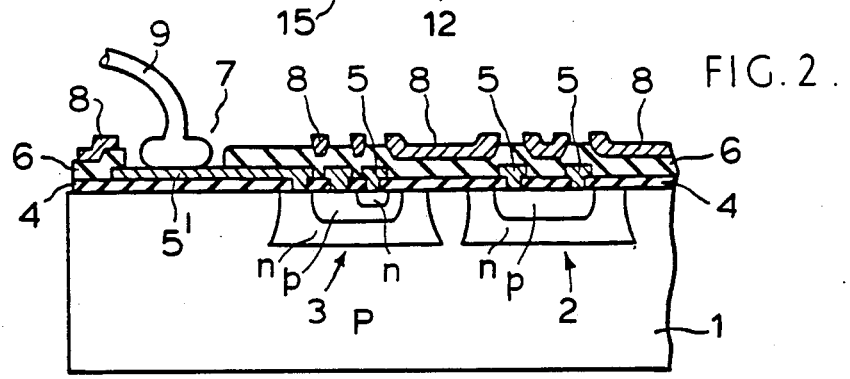
FIG. 2 is a sectional view of a semiconductor device constructed in accordance with one embodiment of the present invention.
Figure 3:
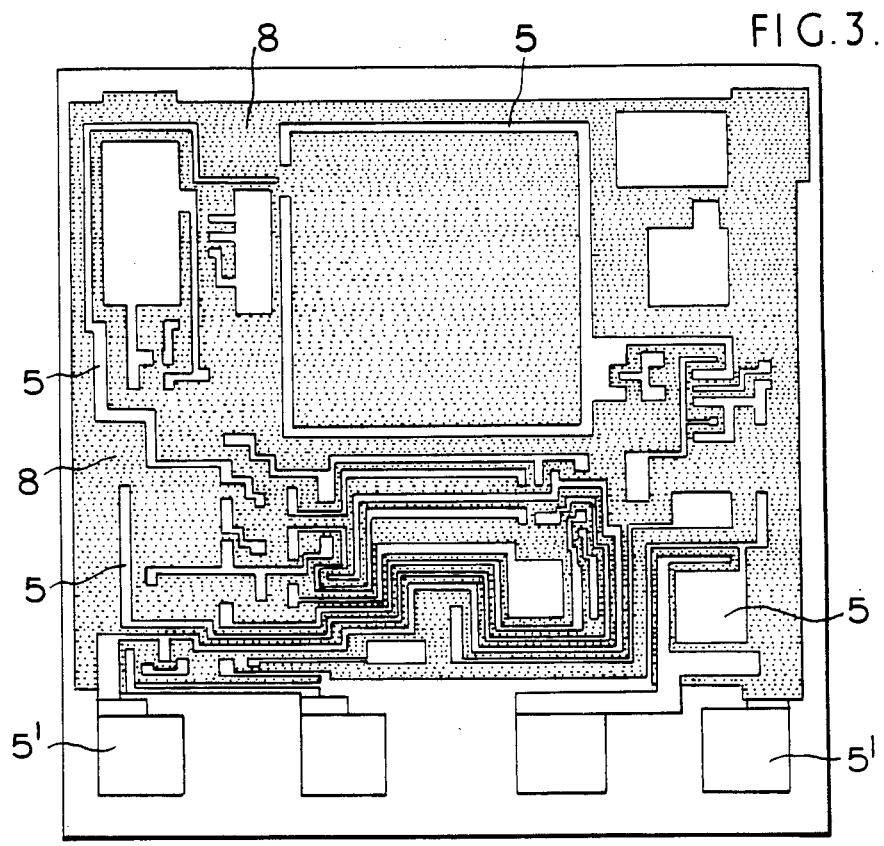
FIG. 3 is a plan view of the semiconductor device of FIG. 2.

Referring to FIG. 2, a cross sectional illustration of light-receiving chip 12 is provided. Chip 12 comprises a p-type silicon substrate 1 including photodiode element 2 and photocurrent amplifying npn transistor 3. The surface of substrate 1 is covered with silicon oxide film 4 which may be on the order of 1.5 um. Wiring-pattern layer 5, obtained by depositing an aluminum film as is known in the art, is formed on film 4. Typically, wiring layer 5 may be on the order of 10 um to 100 um wide. Layer 5 is in ohmic contact with the impurity regions of photodiode 2 and transistor 3 through corresponding contact holes in oxide film 4. Wide bonding pads 5' are formed as terminals for layers 5. An insulating film 6, such as Chemical Vapor Deposition (CVD) $SiO_2$ film or polyimide film, is formed over layer 5. Bonding windows 7 are formed in film 6 to expose corresponding bonding pads 5'. Transparent conductive film 8, such as a polysilicon or indium-tin oxide (ITO) layer, if formed on film 6 and has a thickness of approximately 1 um. A bonding window is formed in film 8 and bonding wires 9 are connected to exposed pads 5'.

In accordance with the method and structure of the present invention for performing reliable on-chip shielding, film 8 is constructed to prevent undesirable electrical contact with layer 5. This is accomplished in the present embodiment by patterning film 8 to be substantially complementary to layer 5. To this end, openings are formed in film 8 at positions corresponding to layers 5 such that the edge of layer 5 is substantially aligned with that of the openings in film 8. Therefore, there is substantially no overlap between film 8 and layer 5. In this manner, small pinholes which may be formed in temperature varying environments will not result in undesirable electrical contact between the conductive shield and the wiring layer. Accordingly, reliable operation is not sacrificed as a result of shielding the semiconductor device from electrically and electromagnetically induced currents.

While film 8 may be provided as a floating shield, as is known in the art, in the presently preferred embodiment film 8 is coupled to ground potential. This may be accomplished in any conventional manner using known in the art. In the present embodiment, contact holes (not shown) are provided in insulating film 6 for coupling film 8 with the grounded portions of wiring pattern layer 5.

As described above, film 8 and layer 5 are formed in a substantially complementary pattern. However, the term "complementary" is not limited to cases where there is no overlap between layers 8 and 5. According to the present invention, complementary patterns include cases where the overlap between layers 8 and 5 is small and the edge of film 8 is not quite flush with the edge of layer 5 along the lateral direction. Complementary patterns also include cases where the edge of film 8 is slightly remote from layer 5 along the lateral direction such that a portion of the semiconductor device not covered by layer 5 is also not covered by film 8. In the latter case it has been found that sufficient shielding can be obtained even if the lateral displacement between film 8 and layer 5 is 2 to 3 micrometers.

In an alternative embodiment of the present invention, film 8 is formed to complement the non-grounded portions of layer 5. In this embodiment, the film is formed above the grounded portions of layer 5, (i.e., the portions of layer 5 which are connected to the reference or ground potential of the circuit) in addition to being formed over those portions of the semiconductor which are not covered by any portion of layer 5. Because conductive shield film 8 is also at ground potential, pinholes which may appear in insulating film 6 in the grounded regions of layer 5 covered by film 8 will have no adverse consequence on the operation of the semiconductor device.

In a still further embodiment, portions of the semiconductor device especially sensitive to electrostatic or electromagnetic induction, such as the portion of wiring layer 5 around the photodiode in Figure 2, may also be covered by conductive shield film 8. These modifications do not depart from the true spirit and scope of the present invention.

The present invention also can be applied to semiconductor devices other than photocoupler light-receiving elements. In other semiconductor devices, a transparent conductive shield film may not be required and a non-transparent conductive shield film may be substituted therefor. Also, if a metal film is used as a shield film, other conductive materials, such as polysilicon, can be used for layer 5. Many combinations of conductive materials for shield film 8 and wiring layer 5 should readily come to mind.

Further, it will be appreciated by those skilled in the art that since film 8 is patterned to be substantially complementary to layer 5, additional advantages over known shield structures may be obtained. A patterning mask for layer 5 and another mask for film 8 with a colored portion complementary to the mask of layer 5 can be used to simplify the design. Alternatively, when photoresists having opposite photosensitive reactions are used, film 8 can be patterned using the patterning mask of layer 5.

The photocoupler incorporating the above mentioned light-receiving integrated circuit was subjected to temperature cycle testing wherein the photocoupler was periodically placed in high and low temperature conditions for reliability testing. The test results indicate that failures and operational errors were almost entirely eliminated. Further, undesirable short circuits between layer 5 and film 8 caused during fabrication were greatly decreased, which in turn increased yield by 10 to 20% as compared to the conventional on-chip shield structure.

While only several presently preferred embodiments of the subject shielding apparatus have been described in detail herein, many variations and modifications will become apparent to those skilled in the art. The claims appended hereto are intended to embody all such modifications and variations which fall within the true scope and spirit of this invention.

We claim:

1. A semiconductor device having high resistance to electrostatic and electromagnetic induction comprising:
   a semiconductor element formed in a semiconductor substrate;
   a first insulating film formed on a surface of said semiconductor substrate;
   a wiring-pattern layer formed on said first insulating film, said wiring-pattern layer contacting said semiconductor substrate through at least one contact hole formed in said first insulating film;
   a second insulating film formed over said first insulating film to cover said wiring-pattern layer; and
   a conductive shield film formed over said second insulating film substantially complementary to said wiring-pattern layer to substantially cover portions of said semiconductor substrate which are not covered by said wiring pattern layer.

2. A semiconductor device according to claim 1 wherein said conductive shield film is connected to ground.

3. A semiconductor device according to claim 1 wherein said semiconductor element comprises a light-receiving integrated circuit including a light sensitive region and an amplifier element.

4. A semiconductor device according to claim 3 wherein said conductive shield film is transparent.

5. A semiconductor device according to claim 3 wherein said conductive shield film does not overlap any portion of said wiring-pattern layer.

6. A semiconductor device according to claim 3 wherein said conductive shield film overlaps selected portions of said wiring-pattern layer.

7. A semiconductor device according to claim 6 wherein said selected portions are portions of said wiring-pattern layer at ground potential.

8. A semiconductor device according to claim 6 wherein said selected portions are those portions of said wiring-pattern layer formed around said light sensitive region of said light-receiving integrated circuit.

9. A semiconductor device having high resistance to electrostatic and electromagnetic induction comprising:
   a semiconductor element formed in a semiconductor substrate;
   a first insulating film formed on a surface of said semiconductor substrate;
   a wiring-pattern layer formed on said first insulating film, said wiring pattern layer contacting said semiconductor substrate through at least one contact hole formed in said first insulating film;
   a second insulating film formed over said first insulating film to cover said wiring-pattern layer;
   a conductive shield film formed over said second insulating film substantially complementary to said wiring pattern layer except to portions of said wiring-pattern layer at ground potential and portions of said semiconductor element and said wiring-pattern layer which are extremely sensitive to electrostatic and electromagnetic induction, said conductive shield substantially covering all other portions of said semiconductor device.

10. A semiconductor device according to claim 9 wherein said conductive shield is coupled to ground.

11. A semiconductor device according to claim 9 wherein said semiconductor element comprises a light-receiving integrated circuit including a light sensitive region and an amplifier element.

12. A semiconductor device according to claim 11 wherein said conductive shield film is transparent.

* * * * *